(12) United States Patent
Pan et al.

(10) Patent No.: US 7,033,888 B2
(45) Date of Patent: Apr. 25, 2006

(54) ENGINEERED METAL GATE ELECTRODE

(75) Inventors: James N. Pan, Santa Clara, CA (US); Paul R. Besser, Sunnyvale, CA (US); Christy Woo, Cupertino, CA (US); Minh Van Ngo, Fremont, CA (US); Jinsong Yin, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 108 days.

(21) Appl. No.: 10/806,117

(22) Filed: Mar. 23, 2004

(65) Prior Publication Data

US 2004/0175910 A1     Sep. 9, 2004

Related U.S. Application Data

(62) Division of application No. 10/360,719, filed on Feb. 10, 2003, now Pat. No. 6,727,560.

(51) Int. Cl.
    *H01L 21/336* (2006.01)

(52) U.S. Cl. .................. 438/257; 438/299; 438/303

(58) Field of Classification Search .................. None
See application file for complete search history.

(56) References Cited

U.S. PATENT DOCUMENTS

| 5,998,873 | A | 12/1999 | Blair et al. |
| 6,368,923 | B1 | 4/2002 | Huang |
| 6,607,958 | B1 | 8/2003 | Suguro |
| 6,727,560 | B1 * | 4/2004 | Pan et al. ............ 257/412 |
| 6,750,500 | B1 * | 6/2004 | Agarwal ............ 257/310 |
| 2002/0030222 | A1 * | 3/2002 | Agarwal ............ 257/310 |
| 2003/0008501 | A1 * | 1/2003 | Bakli et al. ............ 438/653 |
| 2003/0027393 | A1 | 2/2003 | Suguro |
| 2005/0151262 | A1 * | 7/2005 | Tamaru et al. ............ 257/758 |

* cited by examiner

*Primary Examiner*—Ngân V. Ngô

(57) ABSTRACT

A metal gate electrode is formed with an intrinsic electric field to modify its work function and the threshold voltage of the transistor. Embodiments include forming an opening in a dielectric layer by removing a removable gate, depositing one or more layers of tantalum nitride such that the nitrogen content increases from the bottom of the layer adjacent the gate dielectric layer upwardly. Other embodiments include forming the intrinsic electric field to control the work function by doping one or more metal layers and forming metal alloys. Embodiments further include the use of barrier layers when forming metal gate electrodes.

11 Claims, 13 Drawing Sheets

ENGINEERED METAL GATE ELECTRODE

This application is a divisional of Application Ser. No. 10,360,719 filed Feb. 19, 2003, now U.S. Pat. No. 6,727,560.

TECHNICAL FIELD

The present invention relates to semiconductor devices comprising transistors with metal gate electrodes and to fabrication techniques for engineering a metal gate electrode with a tunable work function and high quality gate dielectric. The present invention is particularly applicable to fabricaturing high speed semiconductor devices having submicron design features.

BACKGROUND ART

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of graded well-doping, epitaxial wafers, halo implants, tip implants, lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Recently, metal gate electrodes have evolved for improving the drive current by reducing polysilicon depletion. However, simply replacing polysilicon gate electrodes with metal gate electrodes may engender issues such as, increased leakage current because of an undesired value of work function which in turn provides undesired electrical characteristics for the transistor. The work function is the amount of energy required to excite electrons across a threshold. Polysilicon gates on silicon substrate provide a work function that allows the gates to be adequately controlled. However, the use of a metal gate electrode on a silicon substrate undesirably alters the work function vis-à-vis polysilicon, thereby reducing the controllability of the gate. Another disadvantage of a metal gate process resides in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Accordingly, a need exists for methodology enabling the fabrication of micro-miniaturized semiconductor devices comprising transistors with metal gate electrodes having a tunable work function, improved gate dielectric quality and increased transistor surface mobility.

DISCLOSURE OF THE INVENTION

An advantage of the present invention is a semiconductor device having a transistor with a metal gate electrode having an engineered work function, improved gate oxide quality and effective transistor surface mobility.

Another advantage of the present invention is a method of manufacturing a semiconductor device comprising a transistor with a tunable work function, improved gate oxide quality and effective transistor surface mobility.

Addition advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: a metal gate electrode, having top, bottom and side surfaces, over a substrate with a gate dielectric therebetween, wherein the metal gate electrode comprises: a layer of tantalum nitride forming the bottom and side surfaces, the layer of tantalum nitride having a nitrogen content that increases from the gate dielectric layer toward the top surface.

Embodiments of the present invention comprise a metal gate electrodes having a single graded layer of tantalun nitride forming the bottom and side surfaces of the gate electrode wherein in the nitrogen content increases from 10 at. % at the bottom interfacing with the underlying gate dielectric layer to 70 at. % at the upper surface of the tantalum nitride layer, the remainder of the gate electrode comprising a metal, such as copper (Cu), a Cu alloy, tantalum, tantalum nitride or tungsten. Embodiments of the present invention include forming multiple layers of tantalum nitride, such as two or three layers, wherein each layer of tantalum nitride has a nitrogen content greater than the underlying layer. Embodiments of the present invention include forming layers of tantalum nitride having a thickness of 15 Å to 25 Å.

Another aspect of the present invention is a method of manufacturing a semiconductor device, the method comprising forming a removable gate over a substrate with a gate dielectric layer therebetween; forming a dielectric layer over the substrate and exposing an upper surface of the removable gate; removing the removable gate leaving an opening in the dielectric layer, the opening defined at its bottom by the gate dielectric layer and defined at its sides by exposed surfaces of the dielectric layer; depositing at least one conductive layer, having a work function, on the gate dielectric layer lining the opening at the bottom and sides; modifying the work function of the conductive layer by creating an intrinsic electric field within the metal gate electrode; and depositing a metal on the conductive layer with the modified work function filling the opening.

Embodiments include depositing a layer of tantalum nitride and modifying the work function by varying the nitrogen content across the tantalum nitride layer during deposition such that the nitrogen content increases from the bottom of the tantalum nitride layer at the interface between the gate dielectric layer upwardly in a direction away from the gate dielectric. Embodiments of the present invention further include forming multiple layers of tantalum nitride, each layer having a nitrogen content higher than the underlying layer.

Other embodiments of the present invention include depositing one or more conductive layers and modifying the upper surface of the conductive layer by doping with an impurity. Further embodiments of the present invention comprise engineering the work function of the metal gate by sequentially forming metal layers and heating to form an alloy therebetween.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF DRAWINGS

In FIGS. 1 through 11, similar features are denoted by similar reference characters.

DESCRIPTION OF THE INVENTION

The present invention address and solves problems attendant upon conventional practices comprising forming polysilicon gate electrodes stemming from their high resistivity and, hence, slower speed. The present invention also addresses and solves problems attendant upon the use of metal gates to replace polysilicon gates, such as degradation of the metal gates and degradation of the underlying gate dielectric.

The present invention addresses and solves such problems by employing a replacement metal gate technique wherein the metal gate electrode is formed after completing high temperature processing, as for activating the source/drain regions. The present invention also provides methodology enabling engineering the work function or tuning the work function of the metal gate electrode, as well as improving gate oxide quality and achieving effective transistor surface mobility.

In accordance with embodiments of the present invention, a replacement gate electrode technique is implemented by forming the metal gate electrode after all high temperature cycles are complete, such as source/drain activation annealing. In implementing such a replacement metal gate electrode technique, metal gate electrode engineering is implemented in accordance with embodiments of the present invention to achieve a tunable work function by forming an intrinsic electric field within the metal gate electrode. Such gate electrode engineering to achieve a tunable work function may be implemented by several techniques.

In an embodiment of the present invention, after removing a removable or "dummy" gate, such as a polysilicon gate, one or more layers of tantalum nitride are deposited such that the nitrogen content increases from the bottom of the metal gate proximate the underlying gate dielectric layer increasing in an upward direction. In another embodiment of the present invention, gate electrode engineering to achieve a tunable work function is effected by doping one or more metal layers deposited subsequent to removing the dummy polysilicon gate. In another embodiment of the present invention, metal gate engineering is implemented to achieve a tunable work function by depositing a plurality of metal layers after removing the sacrificial polysilicon, and then heating to alloy the metal layers within the opening thereby adjusting the overall work function.

Figure 1:
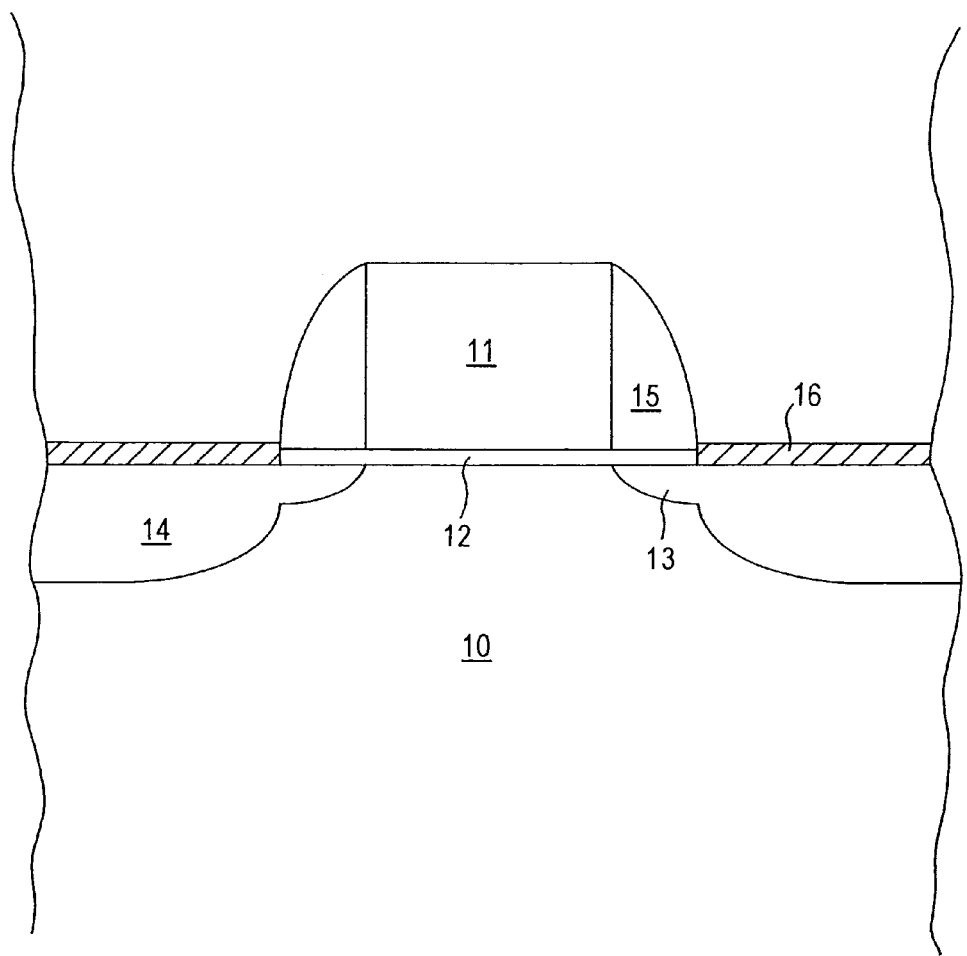
FIGS. 1 through 6 schematically illustrate sequential phases of a method in accordance with an embodiment of the present invention.

An embodiment of the present invention is schematically illustrated in FIGS. 1 through 6. Adverting to FIG. 1, a temporary replaceable or dummy gate 11, such as polysilicon, is formed over substrate 10 with a gate dielectric layer 12 therebetween, such as silicon oxide. Embodiments of the present invention also include depositing a high dielectric constant material for the gate dielectric layer 12, such as $ZrO_2$, $HfO_2$, $InO_2$, $LaO_2$ and $TaO_2$. Shallow source/drain extensions of 14 are formed, dielectric sidewall spacers 15, such as silicon oxide, silicon nitride or silicon oxynitride, are then formed on the removable gate 11. Ion implantation is then conducted to form deep source/drain regions 13, followed by silicidation to form metal silicide layer 16 on the exposed surfaces of the source/drain regions 13, such as nickel silicide. Manipulative steps illustrated in FIG. 1 are implemented in a conventional manner.

Figure 2:
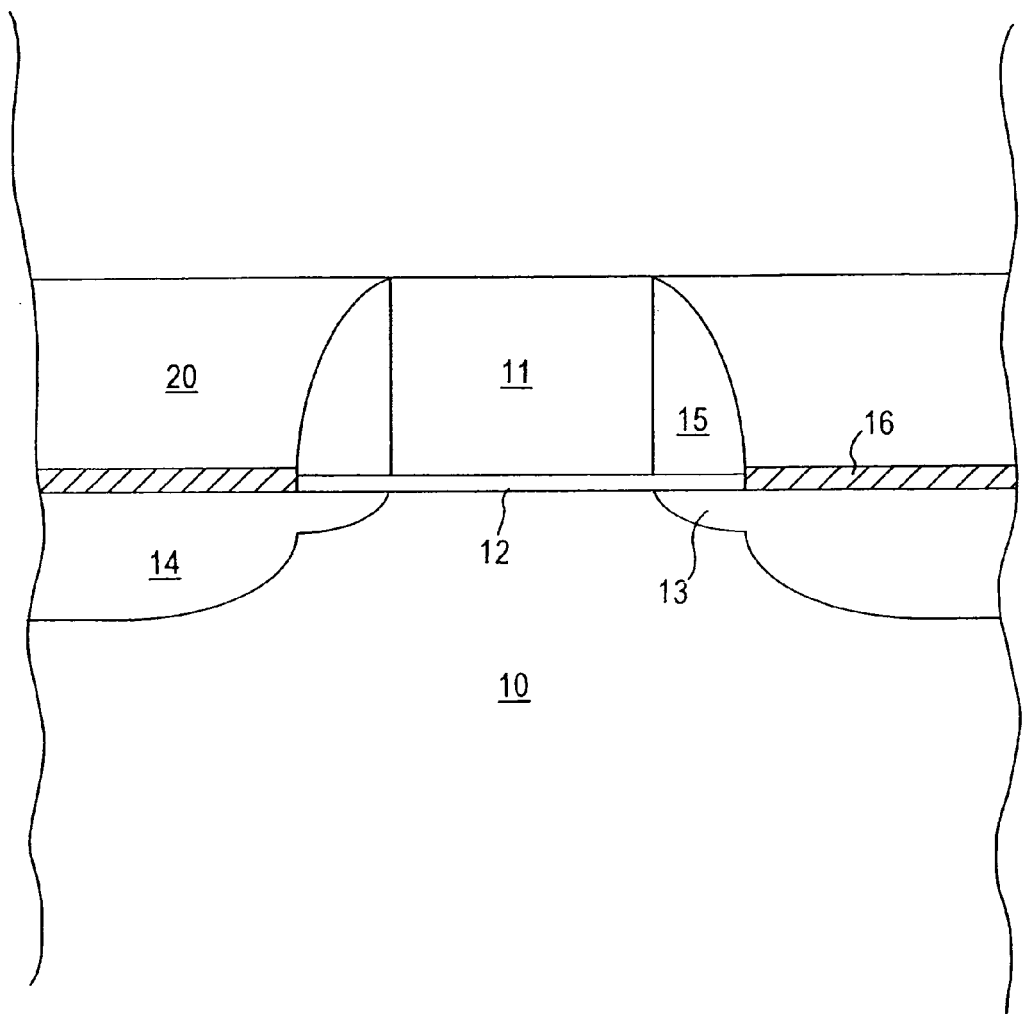

Adverting to FIG. 2, a layer of dielectric material, such as silicon oxide, e.g., silicon oxide formed from tetraethyl orthosilicate (TEOS), is deposited followed by chemical mechanical polishing (CMP) forming layer 20. It should be understood that shallow source/drain extensions 13 and source/drain regions 14 are activated by high temperature thermal annealing, such as at a temperature of about 900° C. and above, at the stage illustrated in FIG. 1 or alternatively, FIG. 2 or alternatively, even at the stage illustrated in FIG. 3 prior to depositing the replacement metal gate electrode.

Figure 3:
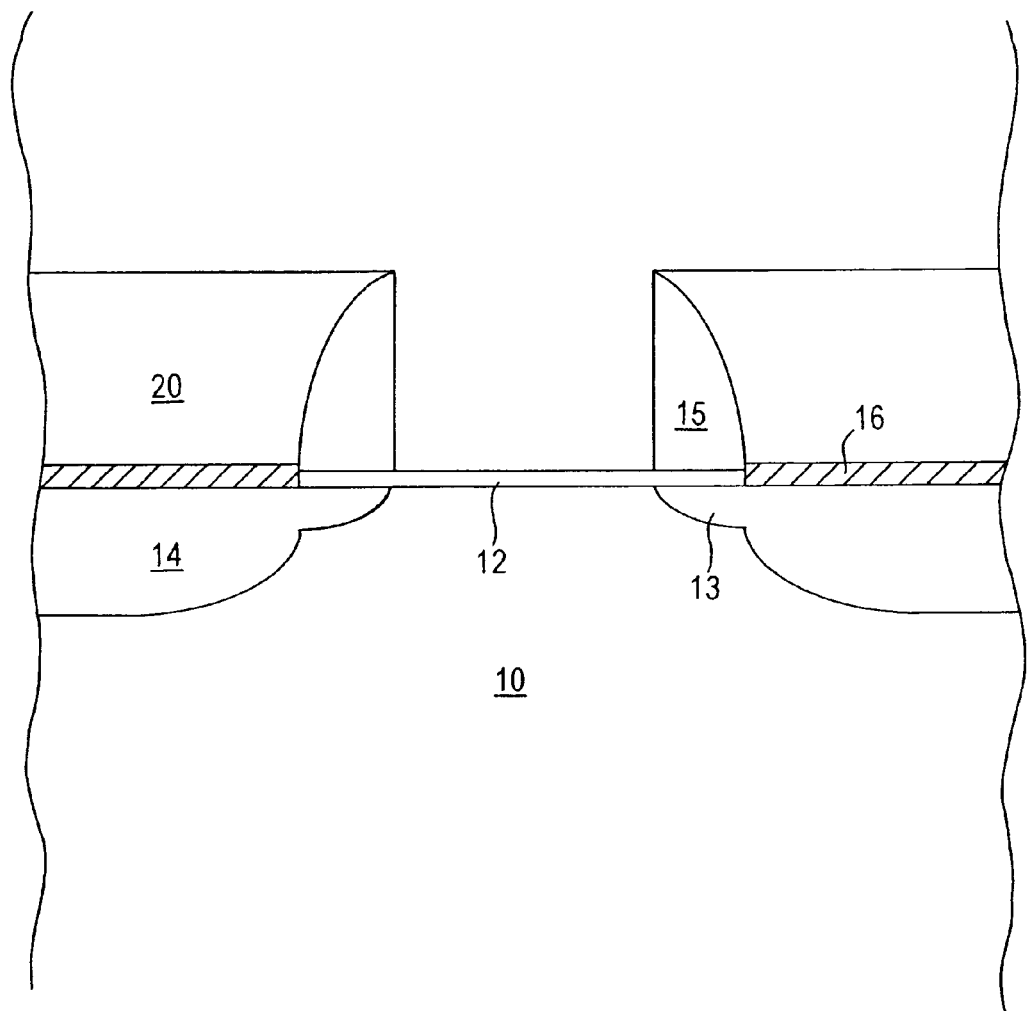
Figure 4A:
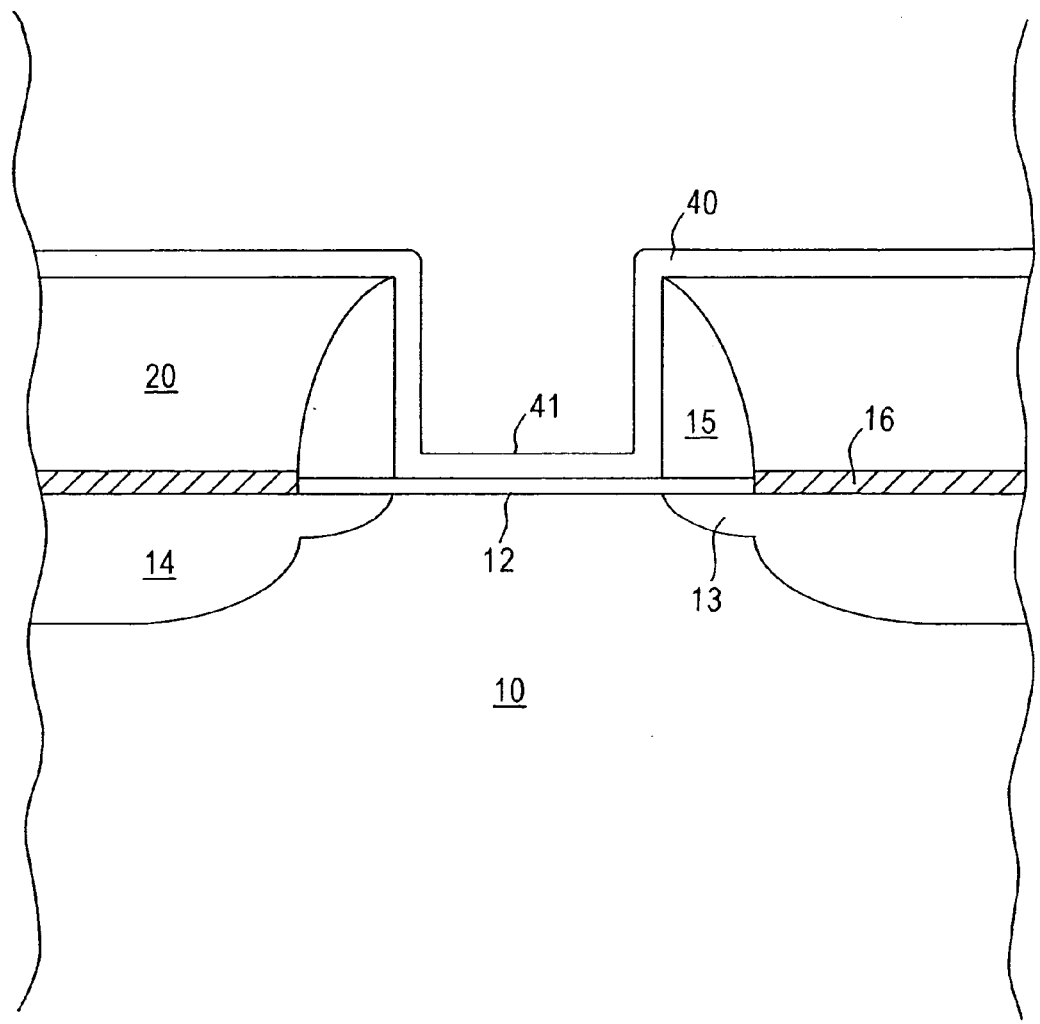

As illustrated in FIG. 3, replacement or dummy gate 11 is removed, as by etching, e.g., using a solution of hydrofluoric acid and nitric acid in acetic acid. In accordance with aspects of this embodiment, one or more layers of tantalum nitride are deposited lining opening created by removing the dummy polysilicon gate 11, such that the nitrogen content increases from proximate gate dielectric layer 12 upwardly. For example, as schematically illustrated in FIG. 4A, a single layer of tantalum nitride 40 is deposited with a graded nitrogen content increasing gradually from the interface with gate dielectric layer 12 upwardly towards the upper surface 41 of tantalum nitride layer 40. Embodiments of the present invention include depositing the tantalum nitride layer 40 by physical vapor deposition (PVD) at a DC voltage of 0.7 to 10 kw and at a temperature of 25° C. to 50° C. During deposition of tantalum nitride layer 40, the nitrogen ($N_2$) flow rate is varied between 10 and 100 sccm such that the nitrogen content of the tantalum nitride layer 40 gradually increases within a range of about 10 at. % at the interface with gate dielectric layer 12 to about 70 at. % at the upper surface 41. Typically, tantalum nitride layer 40 is deposited at a thickness of about 15 Å to about 1000 Å, e.g., 15 Å to 25 Å. Gate dielectric layer 12 is typically formed at a thickness of less than 15 Å, such as 5 Å to 15 Å.

Figure 4B:
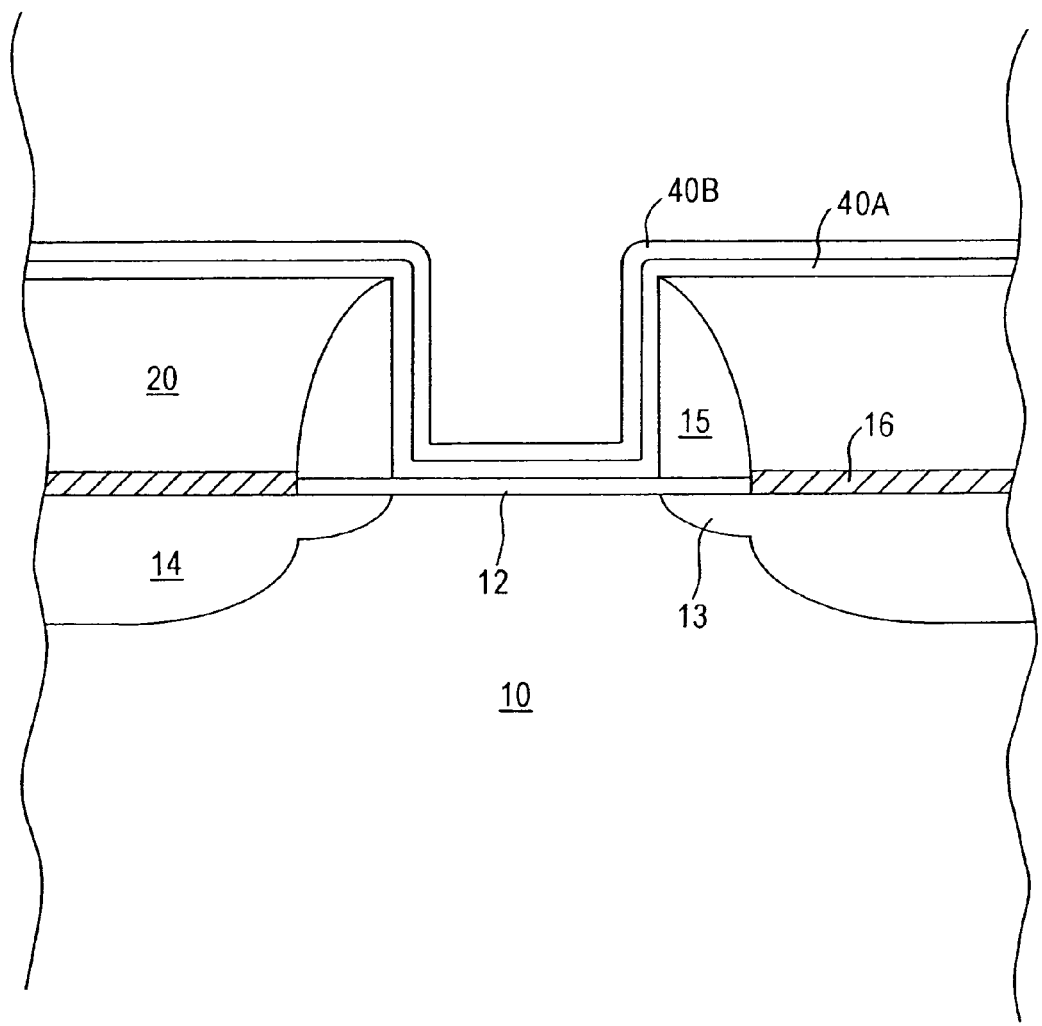
Figure 4C:
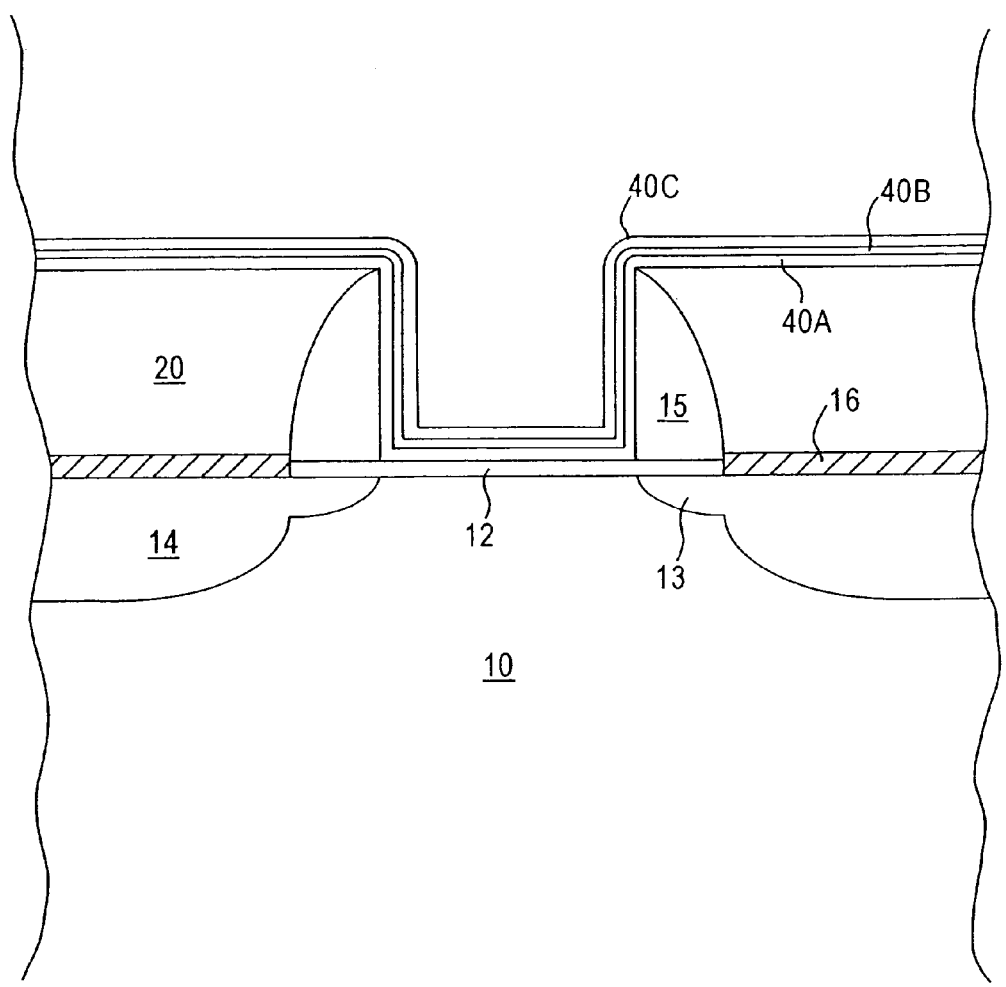

In a variation of this embodiment, the tantalum nitride layer is deposited in two sub-layers 40A and 40B as illustrated in FIG. 4B. In this variation, tantalum nitride layer 40B is deposited under conditions such that it has a nitrogen content greater than the nitrogen content of tantalum nitride layer 40A. For example, tantalum nitride layer 40A may be deposited at a DC power of about 0.7 kw and a $N_2$ flow rate of about 10 sccm to 20 sccm; while tantalum nitride layer 40B may be deposited at DC power of 1 kw and a $N_2$ flow rate of 20 to 50 sccm. Each of layers 40A and 40B may be deposited at a thickness of 15 Å to 25 Å. The nitrogen content of tantalum nitride layers 40A and 40B may be just as such that the tantalum nitride layer 40A has a nitrogen content of 20 to 40 at. %, while tantalum nitride 40B has a nitrogen content of 60 to 80 at. %.

In another variation of this embodiment, the tantalum nitride layer can be deposited in three sub-layers, 40A, 40B, 40C, each at a thickness of 15 Å to 25 Å, under conditions such the nitrogen content of tantalum nitride layer 40C is greater than that of tantalum nitride 40B which is greater than that of tantalum nitride layer 40A. For example, tantalum nitride layer 40A may be deposited by PVD at a DC voltage of 0.7 kw and a $N_2$ flow rate of 10 sccm; tantalum nitride layer 40B can be deposited at DC voltage of 1 kw and a $N_2$ flow rate of 20 sccm; and tantalum nitride layer 40C may be deposited at a DC voltage of 1 kw and a $N_2$ flow rate of 50 sccm. By appropriately adjusting the $N_2$ flow rate during deposition, tantalum nitride layer 40A may have a nitrogen content of 15 to 25 at. %, e.g., 20 at. %; tantalum nitride layer 40B may have a nitrogen content of 40 to 70 at. %, e.g., 60 at. % and tantalum nitride layer 40C may have a nitrogen content of 60 to 80 at. %, e.g., 70 at. %.

The variation in nitrogen content across the thickness of the tantalum nitride layer or layers, creates an intrinsic electric field which modifies the work function and threshold voltage of the MOS transistor. It was found that as the nitrogen concentration of the tantalum nitride layer increases, the work function is reduced. Accordingly, by appropriately adjusting the nitrogen profile in the tantalum nitride layer, the work function can be fine tuned to a desired value.

Figure 5:
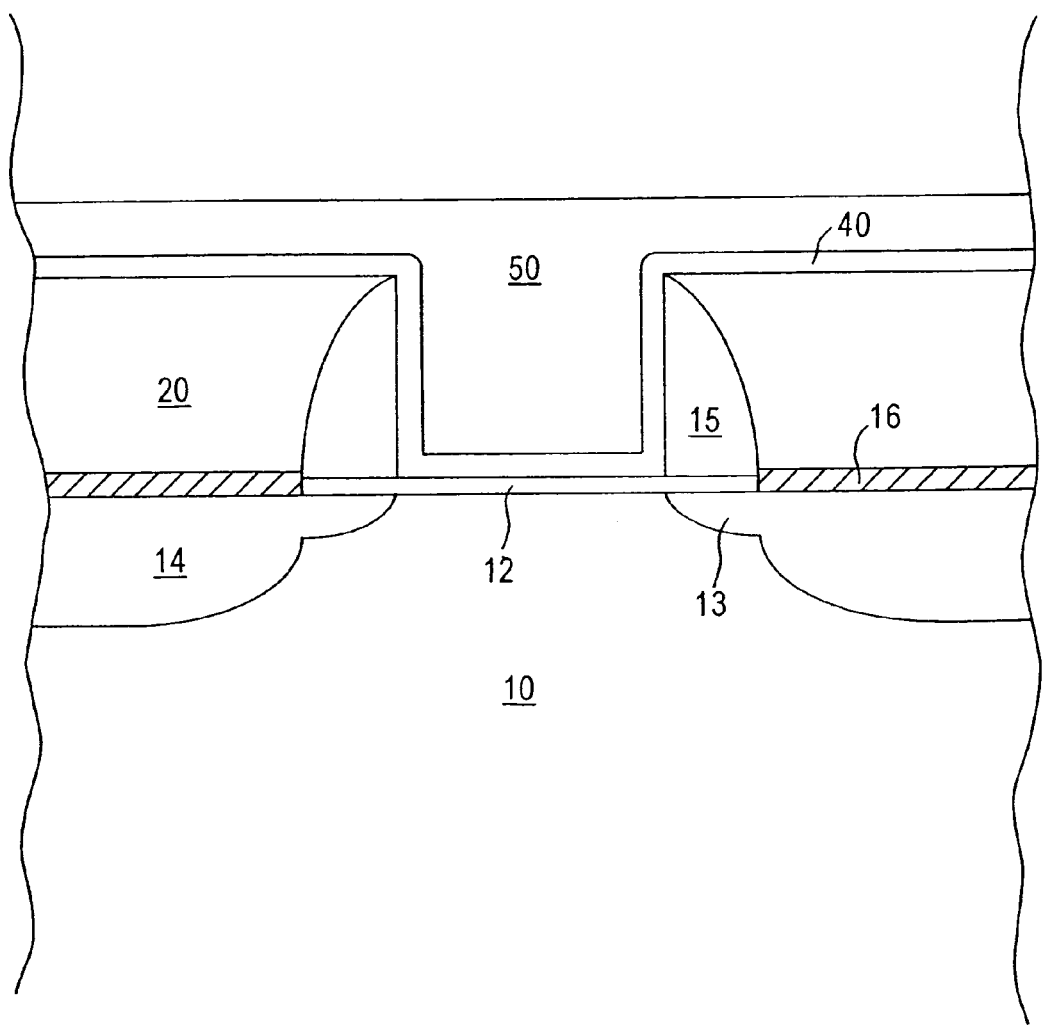

Subsequently, as illustrated in FIG. 5, a layer of conductive material 50, such as copper (Cu) or a Cu alloy is deposited. As used throughout this application the symbol Cu is intended to encompass high purity elemental copper as well as Cu-based alloys, such as Cu alloys containing minor amounts of tantalum, indium, tin, zinc, manganese, titanium, magnesium, chromium, germanium, strontium, platinum, aluminum or zirconium. Other suitable metals include nickel, ruthenium, cobalt, molybdenum and alloys thereof.

Figure 6:
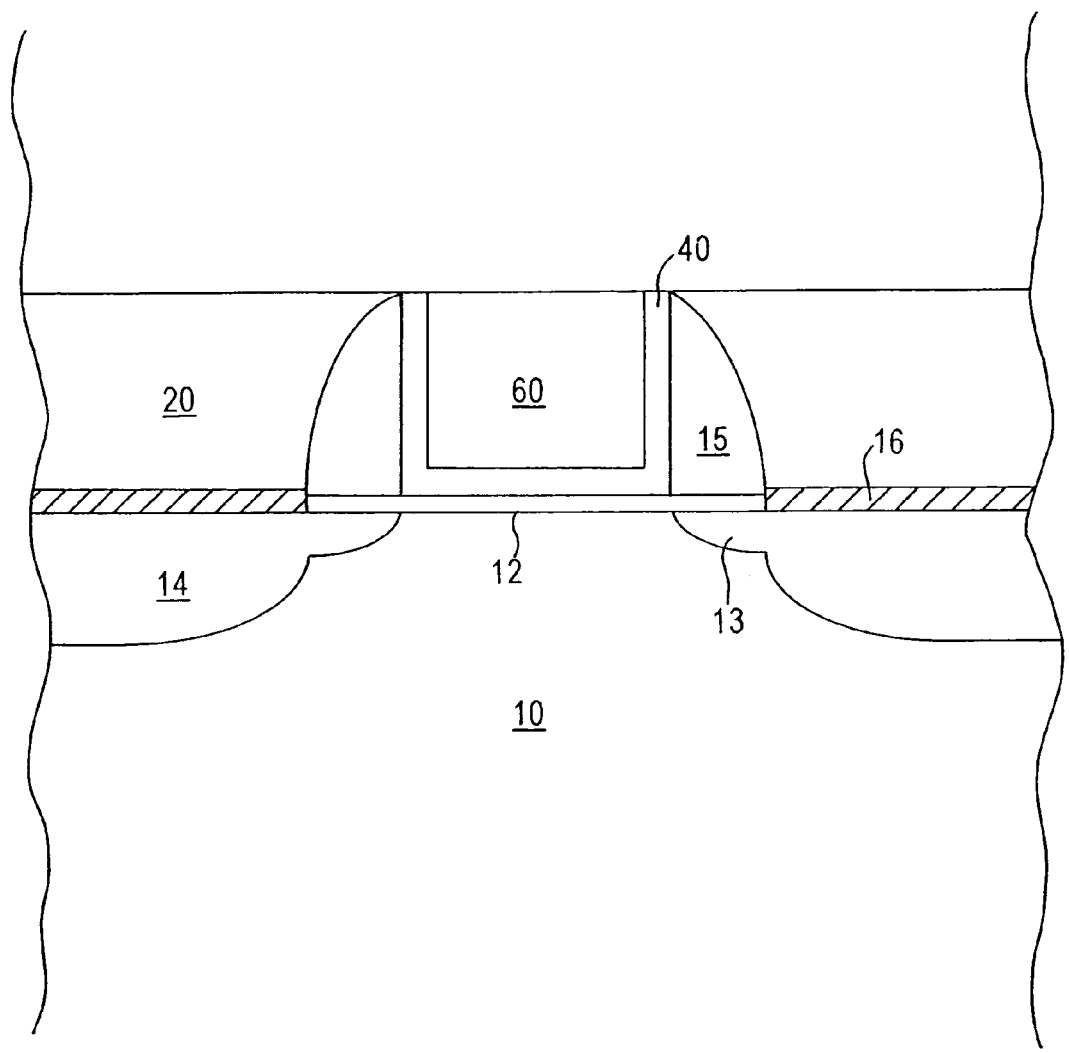
Figure 7:
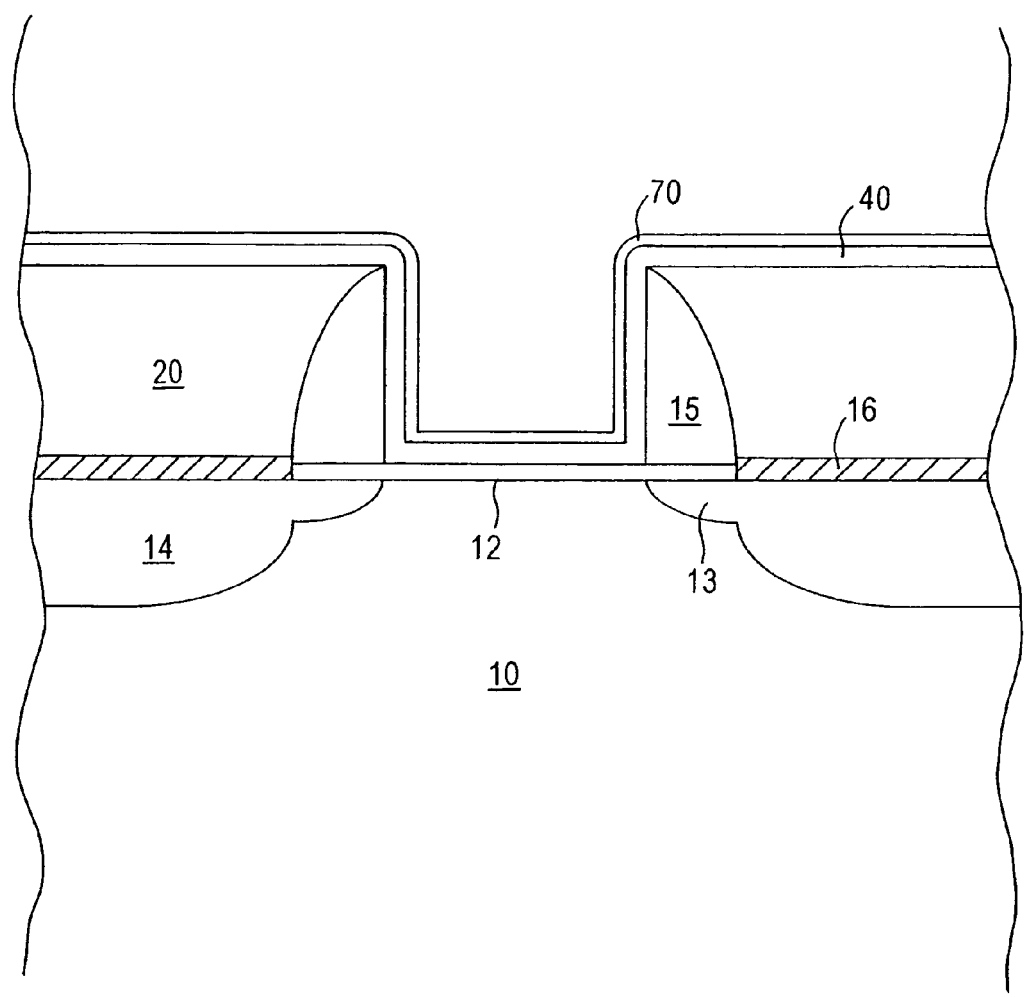
FIGS. 7 through 9 represent sequential phases of another embodiment of the present invention.

CMP is then implemented to planarize the upper surface of the deposited conductive material, thereby completing the metal gate structure comprising tantalum nitride layer 40 with the modified work function and the Cu portion 60 as illustrated in FIG. 6.

Figure 8:
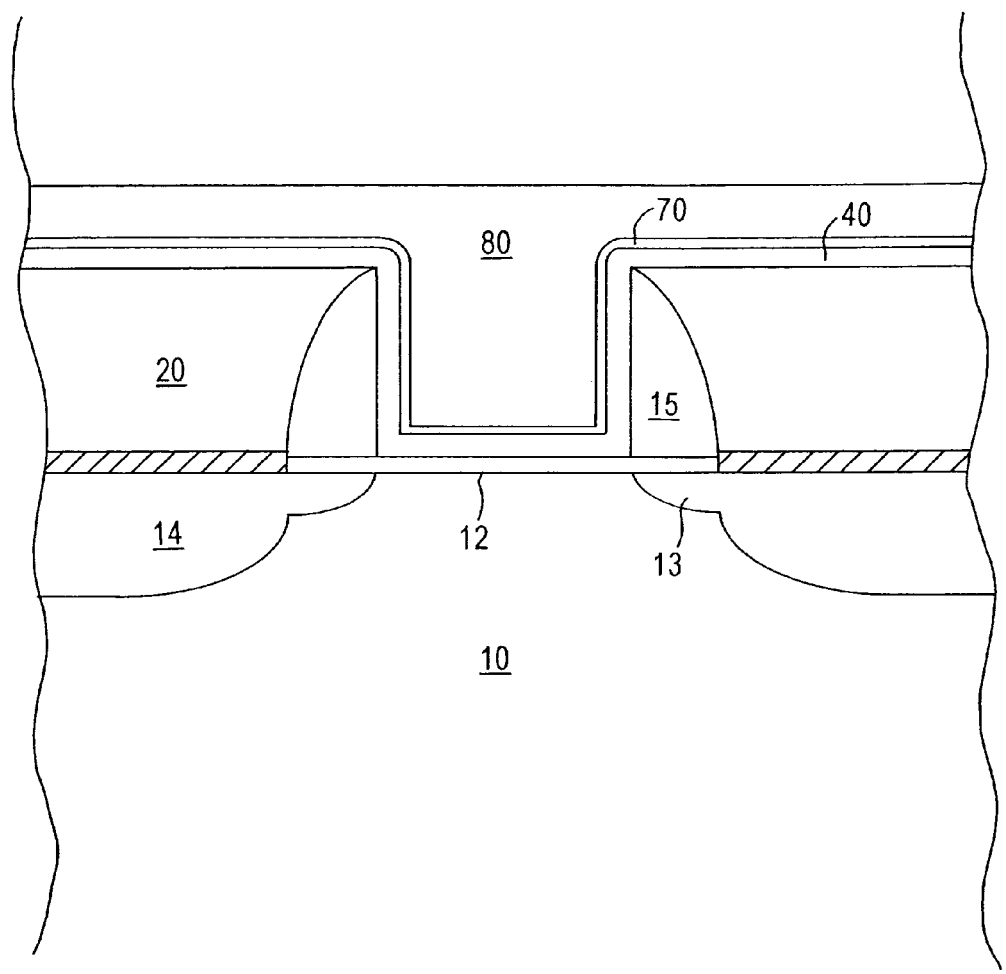
Figure 9:
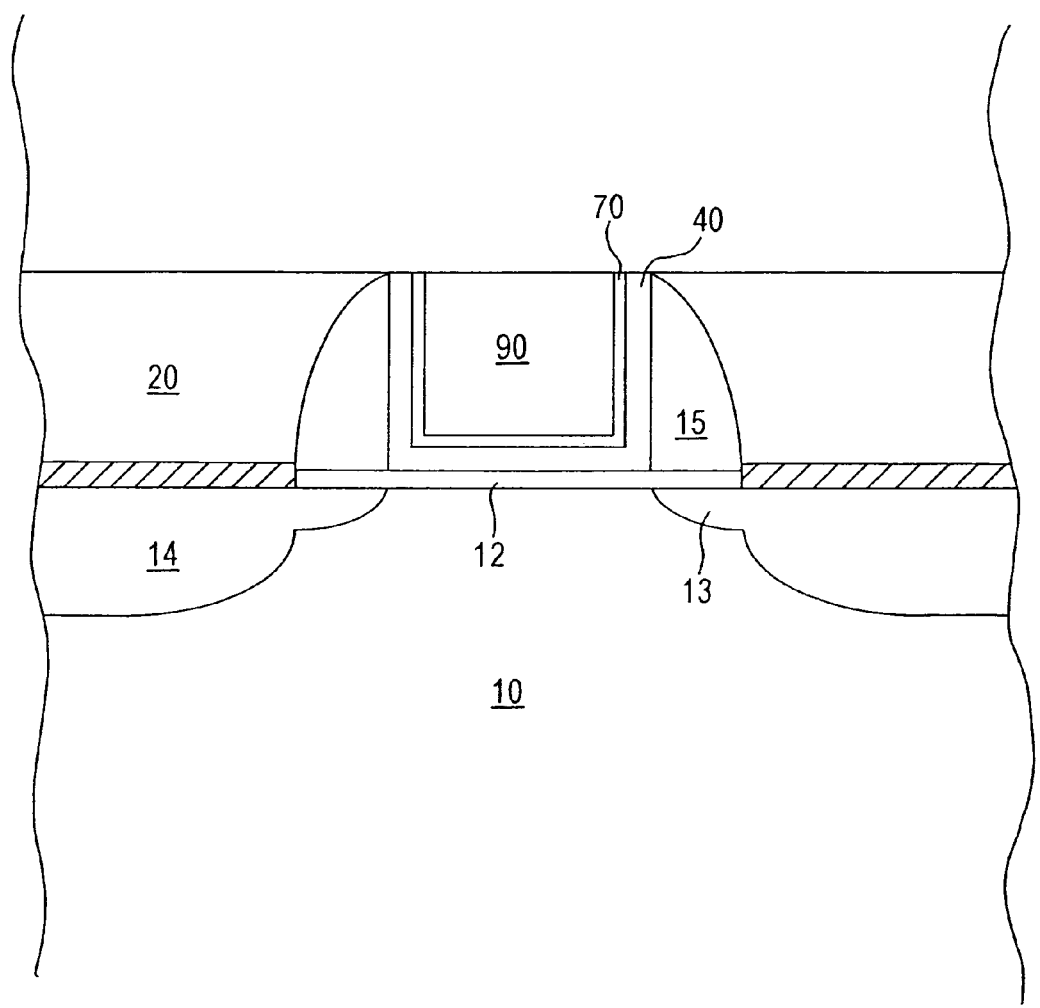

In another embodiment of the present invention, a metal layer is deposited in the intermediate structure depicted in FIG. 3, such as a layer of tantalum nitride, with or without a graded nitrogen content, and a doped layer 70 is formed on the surface of the deposited layer 40. The doped layer 70 may comprise silicon, phosphorus, boron, arsenic, oxygen or carbon. The doped layer 70 can be formed by annealing the intermediate structure comprising layer 40, in an atmosphere of different gases containing the dopant impurity, as at a temperature of about 300° C. to 600° C. For example, tantalum nitride layer 40 may be annealed in silane at a flow rate of about 10 to about 50 sccm. Subsequently, as shown in FIG. 8, a layer of metal 80, such as Cu or Cu alloy, is deposited, followed by CMP to form the structure illustrated in FIG. 9 comprising a replacement metal gate with Cu or Cu alloy 90, doped layer 70 and tantalum nitride layer 40.

Figure 10:
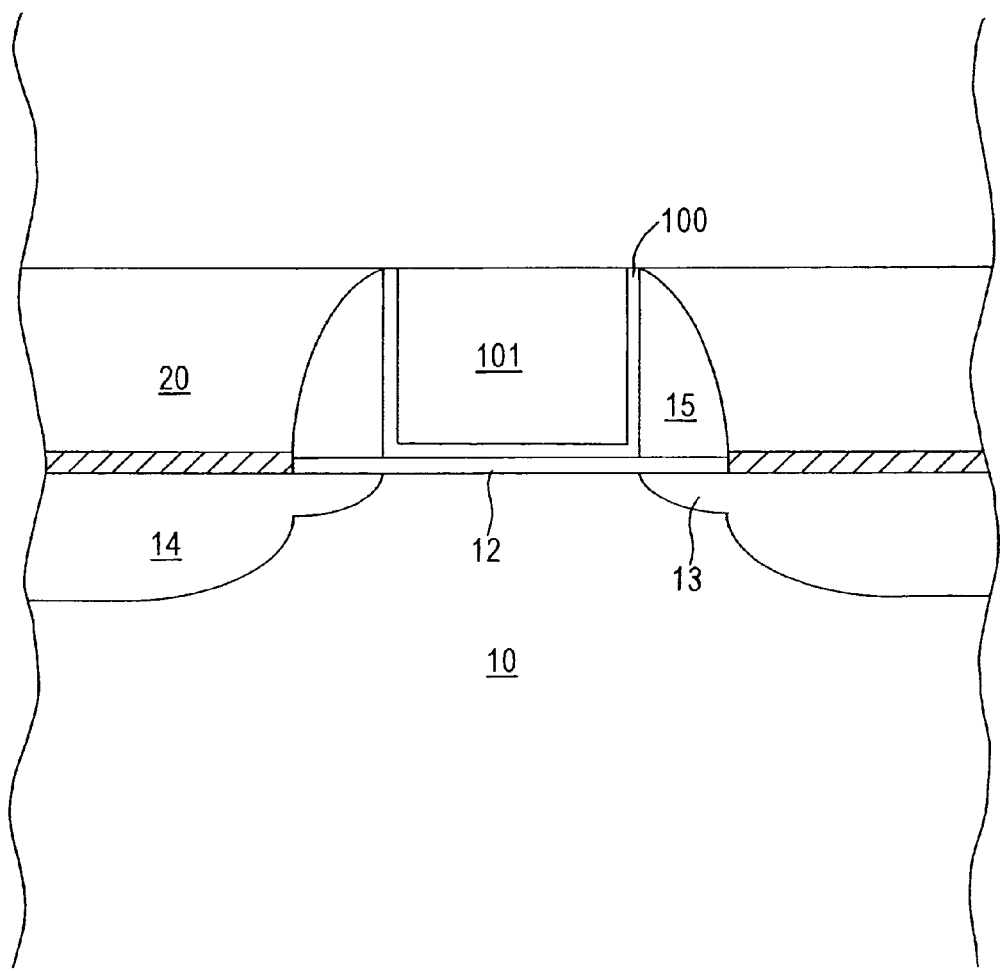
FIG. 10 represents yet another embodiment of the present invention.

A further embodiment of the present invention comprises depositing a barrier metal when forming a replacement gate electrode, such as a diffusion barrier. Suitable diffusion barrier layers include nickel, titanium nitride and tantalum nitride. The resulting structure is illustrated in FIG. 10 and comprises diffusion barrier 100, e.g., nickel, titanium nitride or tantalum nitride, and Cu metal gate portion 101.

Figure 11:
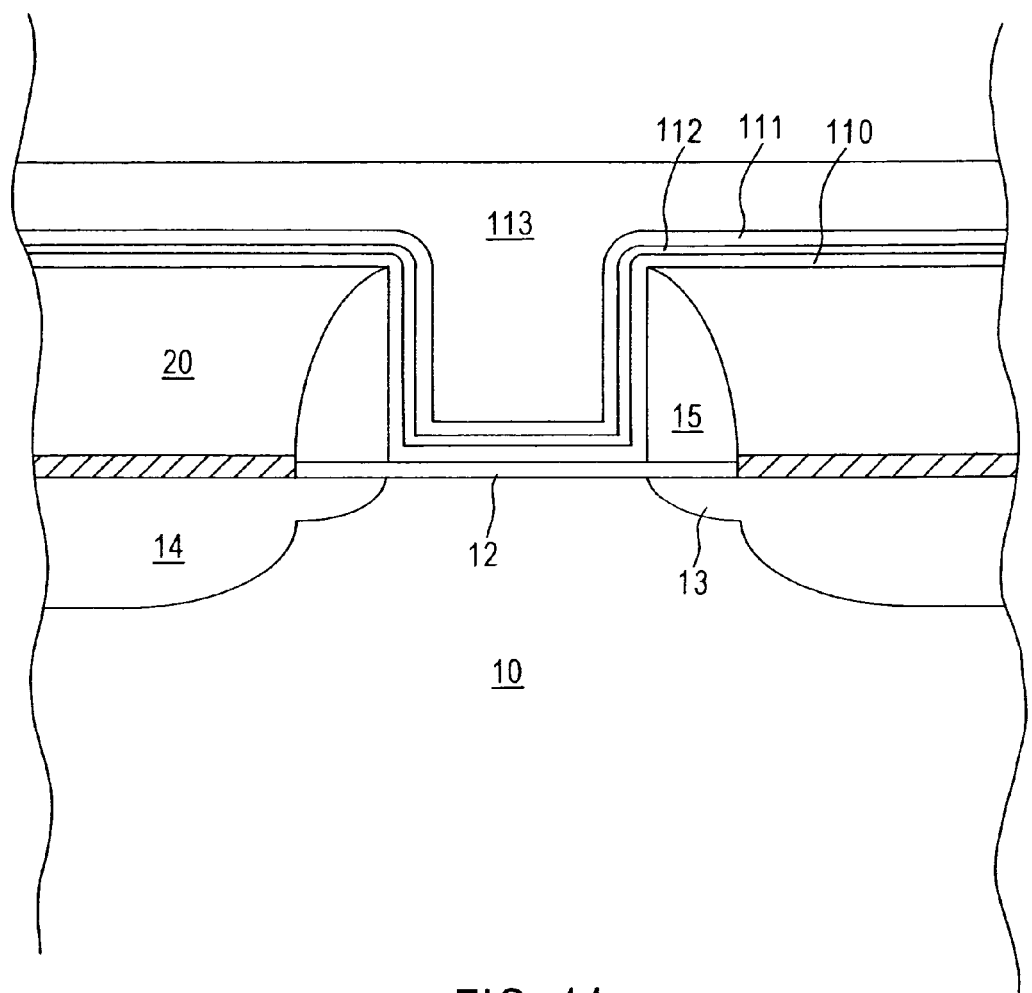
FIG. 11 represents further embodiment of the present invention.

In another embodiment of the present invention illustrated in FIG. 11, a plurality of metal layers are deposited an then alloyed. The formation of an intermediate alloy layer enables adjustment in the overall electrical property and work function of the MOS. For example, as illustrated in FIG. 11, first metal layer 110 is deposited, such as nickel, and then a second metal 111 is deposited, such as copper. The structure is then heated to a temperature and for a period of time sufficient to effect alloying between layers 110 and 111 forming a metal alloy layer 112 therebetween, such as a nickel-copper alloy. Subsequently, metal 113 is deposited, such as Cu, resulting in the structure illustrated in FIG. 11, subsequently, CMP (not shown) is implemented as in the previously illustrated embodiments.

The present invention provides methodology enabling the fabrication of semiconductor devices having transistors with engineered metal gate electrodes with tunable work functions, improved gate dielectric integrity and effective transistor surface mobility. The present invention enables adjustment of the electric field within the metal gate electrode thereby enabling fine tuning of the work function for particular applications.

The present invention enjoys industrial applicability in the fabrication of various types of semiconductor devices. The present invention is particularly applicable in fabricating semiconductor devices having submicron features and exhibiting a high drive current and minimized leakage current.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present application. It is to be understood that the present invention is capable of use in various other combinations and environments, and is capable of changes or modifications within the scope of the inventive concept as expressed herein.

What is claimed is:

1. A method of manufacturing a semiconductor device having a transistor with a metal gate electrode, the metal gate electrode having upper and lower surfaces, the method comprising:
   forming a removable gate over a substrate with a gate dielectric layer therebetween;
   forming a dielectric layer over the substrate and exposing an upper surface of the removable gate;
   removing the removable gate leaving an opening in the dielectric layer, the opening defined at its bottom by the gate dielectric layer and defined at its sides by exposed surfaces of the dielectric layer;
   deposing at least one conductive layer, having a work function, on the gate dielectric layer lining the opening;
   modifying the work function of the conductive layer by creating an intrinsic electric field therein; and
   depositing a metal on the conductive layer with the modified work function filling the opening.

2. The method according to claim 1, comprising annealing to activate source/drain extensions and source/drain regions before depositing the conductive layer.

3. The method according to claim 1, comprising depositing a single layer of tantalum nitride; and modifying the work function by varying the nitrogen contents such that it gradually increases from proximate the gate dielectric layer toward the upper surface by controlling the flow of nitrogen while depositing the tantalum nitride layer.

4. The method according to claim 3, comprising forming the tantalum nitride layer at a thickness of 15 Å to 25 Å.

5. The method according to claim 3, comprising varying the nitrogen content such that it gradually increases from 10 at. % proximate the gate dielectric layer upwardly to 70 at. %.

6. The method according to claim 1, comprising forming a plurality of tantalum nitride layers, each layer having a nitrogen content greater than that of an underlying tantalum nitride layer.

7. The method according to claim 6, comprising:

depositing a first layer of tantalum nitride, having a nitrogen content of 15 at. % to 25 at. %, on the gate dielectric layer, depositing a second layer of tantalum nitride, having a nitrogen content of 40 at. % to 70 at. %, on the first tantalum nitride layer; and depositing a third tantalum nitride layer, having a nitrogen content of 60 at. % to 80 at. %, on the second tantalum nitride layer.

8. The method according to claim 3, further comprising forming an impurity doped layer on the layer of tantalum nitride.

9. The method according to claim 1, comprising modifying the work function of the conductive layer by introducing a dopant impurity into a surface thereof.

10. The method according to claim 1, comprising depositing a plurality of metal layers and annealing to form an alloy thereof.

11. The method according to claim 1, comprising depositing a barrier layer in the opening before depositing the conductive layer.

* * * * *